US008077114B2

(12) United States Patent  
Lehnberger et al.

(10) Patent No.: US 8,077,114 B2  
(45) Date of Patent: Dec. 13, 2011

(54) PROCESS FOR THE PRODUCTION OF AN ELECTRICALLY CONDUCTIVE STRUCTURE

(75) Inventors: Walter Lehnberger, Treuchtlingen (DE); Michael Rohm, Furth (DE)

(73) Assignee: Leonhard Kurz Stiftung & Co. KG, Furth (DE)

( * ) Notice: Subject to any disclaimer, the term of this patent is extended or adjusted under 35 U.S.C. 154(b) by 737 days.

(21) Appl. No.: 12/163,442

(22) Filed: Jun. 27, 2008

(65) Prior Publication Data

US 2009/0004437 A1  Jan. 1, 2009

(30) Foreign Application Priority Data

Jun. 29, 2007 (DE) .................. 10 2007 030 414

(51) Int. Cl.
*H01Q 1/38* (2006.01)
*H05K 1/11* (2006.01)
*H05K 3/24* (2006.01)

(52) U.S. Cl. .................... 343/895; 29/854; 427/97.3
(58) Field of Classification Search ........... 343/700 MS, 343/873, 895; 438/622; 29/600, 829, 854; 427/97.3; 428/172

See application file for complete search history.

(56) References Cited

U.S. PATENT DOCUMENTS

| 4,392,013 | A | 7/1983 | Ohmura et al. |
| 5,278,727 | A | 1/1994 | Westbrook et al. |
| 6,335,626 | B1 | 1/2002 | Motulla |
| 6,421,013 | B1 * | 7/2002 | Chung .................. 343/700 MS |
| 6,549,176 | B2 * | 4/2003 | Hausladen .................. 343/895 |
| 2005/0272249 | A1 | 12/2005 | Karl et al. |

FOREIGN PATENT DOCUMENTS

| DE | 3048740 | 9/1981 |
| DE | 10254927 | 6/2004 |

OTHER PUBLICATIONS

European Search Report, Aug. 27, 2009, Appln. No. 08011513.

* cited by examiner

*Primary Examiner* — Michael C Wimer  
(74) *Attorney, Agent, or Firm* — Hoffman & Baron, LLP

(57) ABSTRACT

The invention concerns a process for the production of an electrically conductive structure on a carrier substrate comprising at least two conductor track portions spaced in a region of a width b over the entire width b at between 500 μm and 1 μm and a multi-layer film body. A conductive layer in the form of the conductor track portions is produced on the surface of the carrier substrate. A metallic coating forming the electrically conductive structure is deposited on the conductive layer by application of a flow of current in an electrolyte which contains a dissolved coating metal. In the production of the conductive layer the conductive layer is additionally produced in the form of conductor track extensions which are arranged on both sides of the conductor track portions and which are convexly curved away from the oppositely disposed conductor track portion.

20 Claims, 2 Drawing Sheets

PROCESS FOR THE PRODUCTION OF AN ELECTRICALLY CONDUCTIVE STRUCTURE

CROSS-REFERENCE TO RELATED APPLICATIONS

This application claims priority based on German Patent Application No. 10 2007 030 414.7, filed on Jun. 29, 2007 which is incorporated herein by reference.

BACKGROUND

The invention concerns a process for the production of an electrically conductive structure and a multi-layer film body comprising a carrier substrate, an electrically conductive layer provided in pattern form on the surface of the carrier substrate and a metallic coating forming an electrically conductive structure and galvanically deposited on the conductive layer.

The manufacture of conductive structures on a carrier substrate, in particular in the case of products which are produced in large numbers, is to take place as inexpensively as possible. Thus, for the manufacture of a conductive structure, it is known for a metal coating to be applied to a carrier substrate over the full surface area thereof and for the metal layer then to be structured by an etching process. It is further known for the desired layout to be produced by applying a conductor paste by printing. Those production processes however give rise to high costs because of the large number of necessary process steps and because of the high level of material consumption.

In addition DE 102 54 927 A1 describes a process for the production of conductive structures on a carrier, in which firstly the surface of a carrier is covered with conductive particles and then a passivation layer is applied to the particle layer formed by the conductive particles, which is in the form of a negative image of the conductive structure. The region of the conductive particles, that is not covered by the passivation layer, is then galvanically reinforced, thereby producing the conductive structures on the carrier.

SUMMARY OF THE INVENTION

Now the object of the invention is to permit inexpensive manufacture of an electrically conductive structure on a carrier substrate, which has closely adjacent conductor track portions, and to provide a film body which is inexpensive to produce and having such a conductive structure.

That object is attained by a process for the production of an electrically conductive structure on a carrier substrate comprising at least two conductor track portions spaced in a region of a width b over the entire width b at between 500 µm and 1 µm, wherein a conductive layer in the form of the conductor track portions is produced on the surface of the carrier substrate and a metallic coating forming the electrically conductive structure is deposited on the conductive layer by application of a flow of current in an electrolyte which contains a dissolved coating metal, wherein in the production of the conductive layer the conductive layer is additionally produced in the form of conductor track extensions which are arranged on both sides of the conductor track portions and which are convexly curved away from the oppositely disposed conductor track portion, so that field line concentrations of the electrical field are avoided in galvanic deposit of the coating material in the edge regions of the conductor track portions.

The object of the invention is further attained by a multi-layer film body comprising a carrier substrate, a conductive layer formed in pattern form on the surface of the carrier substrate and a metallic coating which forms an electrically conductive structure and which is deposited on the conductive layer by application of a flow of current in an electrolyte which contains a dissolved coating metal, wherein the electrically conductive layer is produced in a region of a width b in the form of two conductor track portions which are spaced over the entire width b at between 500 µm and 1 µm and the conductive layer is additionally provided in the form of conductor track extensions which are arranged on both sides of the conductor track portions and which are convexly curved away from the oppositely disposed conductor track portion.

Investigations have shown that, when depositing the metallic coating, with the application of a flow of current, the metallic coating grows unequally in closely adjacent conductor track portions. Particularly when galvanic deposit of the coating material is increased by increasing the flow of current in the electrolyte in order to increase the rate of production, the corner regions of the conductor track portions which are in opposite relationship to the other conductor track portion increasingly involve an increased accumulation of the coating material so that the two conductor track portions in the corner regions grow together to constitute a short-circuit, the manufactured product is thus defective and is waste. The fact of the two conductor track portions growing together into the corner region is in fact to be attributed to the extremely high field line density in those regions. Now, the invention avoids the formation of those extremely high levels of field line concentration in respect of the electrical field in those regions of the conductor track portions by the provision of the additional conductor track extensions which are curved convexly away from the oppositely disposed conductor track portion. Admittedly, that slightly increases the material consumption for manufacture of the product, but on the other hand the reject rate can be reduced and the production speed can be increased by increasing the flow of current in the galvanic coating operation and thus the manufacturing costs can be reduced.

Advantageous developments of the invention are recited in the appendant claims. In accordance with a preferred embodiment of the invention the oppositely disposed flanks of the two conductor track portions are oriented substantially parallel to a common straight line in the region over the entire width b. The reference to substantially parallel means in that respect that the oppositely disposed flanks deviate from the common straight line only in the range of the usual manufacturing tolerance, that is to say not more than 100 µm. Preferably in that case the oppositely disposed flanks deviate from the common straight line by not more than 10% with respect to the width b.

The conductor track portions in the region are preferably spaced from each other over the entire width b at less than 200 µm, in particular being spaced from each other at between 200 and 20 µm. It is precisely in that spacing range that the use of the invention affords substantial advantages in terms of reducing the reject rate or increasing the production speed.

Preferably the width b is more than 400 µm, in particular more than 700 µm. The conductor track portions are preferably formed by mutually oppositely disposed conductor track ends. In that case the conductor track portions can be formed by mutually oppositely disposed end regions of a conductor track which is shaped for example in a loop form, but also by the end regions of two galvanically separated conductor tracks. In that case the conductor track ends are preferably of a width of between 400 µm and 5000 µm and greater.

The application of the invention to conductor track portions which form contact regions for circuit chips has proven to be particularly advantageous. In accordance with a preferred embodiment of the invention the conductor structure is in the form of an antenna and the film body has a circuit chip which is arranged in the region and electrically contacted with the two conductor track portions. Preferably in that case the width b is greater than the edge length of the circuit chip, in particular being 80 µm longer than the edge length of the circuit chip.

Preferably the curved conductor track extensions are provided on both sides of each of the two conductor track portions, directly adjoining the respective conductor track portion. It is however also possible for the conductor track extensions to be provided on both sides of only one of the two conductor track portions, in which case however the risk of the edge regions of the conductor track portions growing together is increased.

In addition it is possible for the front edge of the conductor track extensions, that faces towards the respective other conductor track portion, to be convexly curved, but not the rear edge of the conductor track extensions, that faces away from the respective other conductor track portion. The term conductor track extensions curved convexly away from the oppositely disposed conductor track portion is used to mean conductor track extensions, whose front edge, that faces towards the respective other conductor track portion, is correspondingly curved, independently of the configuration of the rear edge.

The radius of curvature defining the curvature of the conductor track extensions is preferably to be selected greater than the width b. Furthermore it is also possible for the circle of curvature in the points of the curve describing the front edge of the conductor track extensions to alter along the curve. In that case the radius of curvature of the circle of curvature of that curve in a limit region or in the limit point in relation to the associated conductor track portion is to be selected to be greater than the width b. Preferably in that case the radius of curvature in the points of a limit region of a width of 50 µm is selected to be greater than the width b. Furthermore the radii of curvature described hereinbefore are preferably selected to be no greater than double the width b. Investigations have shown that shaping the conductor track extensions in that way makes it possible to achieve a particularly effective relationship between the increase in material expenditure caused by the conductor track extensions and the profit achieved by increasing the production speed/reducing the reject rate.

In accordance with a preferred embodiment of the invention the ends, that face away from the associated conductor track portion, of the oppositely disposed conductor track extensions which are convexly curved away from each other are more than 500 µm away from each other. In many cases that is sufficient to reliably prevent the conductor track portions from growing together.

Preferably, the extent of the conductor track extensions in the direction of the straight line which is defined by the front edge, facing towards the respective other conductor track portion, of the associated conductor track portion is selected to be at least half as great as the width b, preferably three times as great as the width b. Investigations have shown that, with such a configuration for the conductor track portions, the conductor track portions can be reliably prevented from growing together in most situations of use.

The invention is preferably used for the production of RFID transponders (RFID=radio frequency identification) which can be used for example in the form of chip cards but also in the form of labels on goods. The invention can further be used however for the manufacture of any other electrically conductive structures on a carrier substrate, in which electrically conductive structures with closely adjacent conductor track portions are to be inexpensively manufactured.

BRIEF DESCRIPTION OF THE DRAWINGS

The invention is described by way of example hereinafter by means of a number of embodiments with reference to the accompanying drawings in which.

DETAILED DESCRIPTION OF THE PREFERRED EMBODIMENTS

Figure 1:
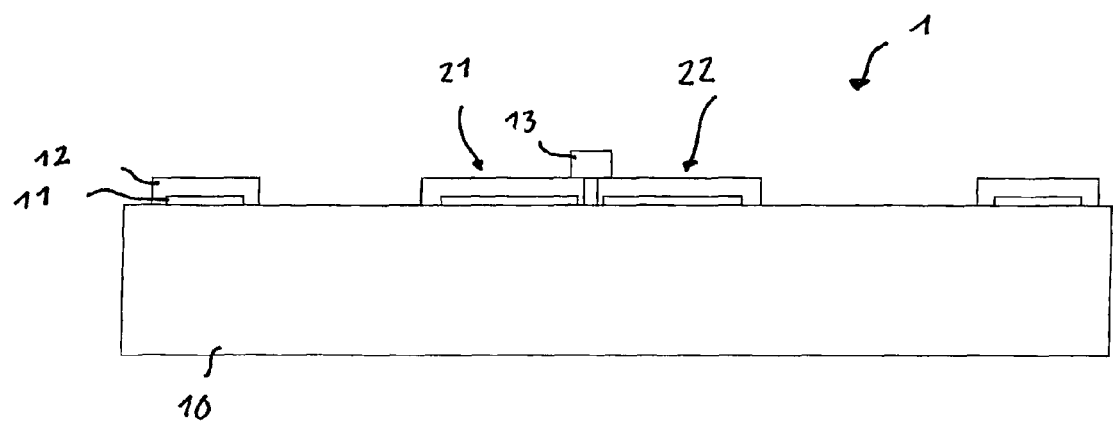
FIG. 1 is a diagrammatic view in section, which is not true to scale, of a film body according to the invention.

FIG. 1 shows a multi-layer film body 1 comprising a carrier substrate 10, a conductive layer 11, a coating 12 deposited on the conductive layer 11 and a circuit chip 13.

The carrier substrate 10 is preferably a plastic material film, for example a PET, PC or BOPP film, of a thickness of between 12 and 150 µm, preferably a thickness of between 23 µm and 75 µm. In addition it is also possible for the carrier substrate also to include one or more further layers, for example decorative layers for producing optical effects, electrical functional layers, for example structured semiconductor polymer layers, protective lacquer layers, bonding layers or release layers.

The conductive layer 11 is now produced on the substrate 10 in a first process step, the thickness of the layer 11 preferably being less than 1 µm. For that purpose preferably a conductive printing material is applied to the surface of the carrier substrate 10 in pattern form by means of a printing process, for example by means of intaglio printing, screen printing or tampon pad printing. In that case the conductive printing material used is preferably metal particles bound in a dispersing agent, for example consisting of iron, copper, nickel, silver, gold, tin or zinc or an alloy of those materials or plated metal particles, for example silver-plated copper particles. The dispersion is so adjusted in terms of its adhesion properties that it adheres to the carrier substrate 10 and can be detached without residue from the printing tool.

Preferably a silver-bearing printing material is used as the printing material.

Furthermore, it is also possible to use other electrically conductive, printable substances, for example electrically conductive inks or printing materials containing other electrically conductive particles (for example carbon black).

In addition it is also possible for an adhesive layer which can be activated for example by heat, pressure or UV radiation to be applied in pattern form to produce the conductive substrate 11 on the carrier substrate 10. In a second step the carrier substrate 10 is then covered with conductive particles which can be present for example in powder form. The adhesive layer is activated and then the conductive particles which do not adhere to the carrier substrate due to the activated adhesive layer are removed so that, also as shown in FIG. 1, the patterned conductive layer 11 is formed. Furthermore it is also possible for the conductive layer 11 to be applied by means of a hot embossing process by region-wise application of a conductive transfer layer of a hot embossing film and for the carrier substrate 10 to be provided over its full surface area with an electrically conductive layer, for example by vapor deposition, which is then removed again in region-wise manner to produce the conductive layer 11 (by means of etching, ablation or region-wise application of a passivation layer deactivated region-wise for the subsequent galvanizing procedure). In that case the conductive layer 11 is produced on the carrier substrate 10 by the above-described process in the form shown by reference to FIG. 2, being structured in pattern form.

Figure 2:
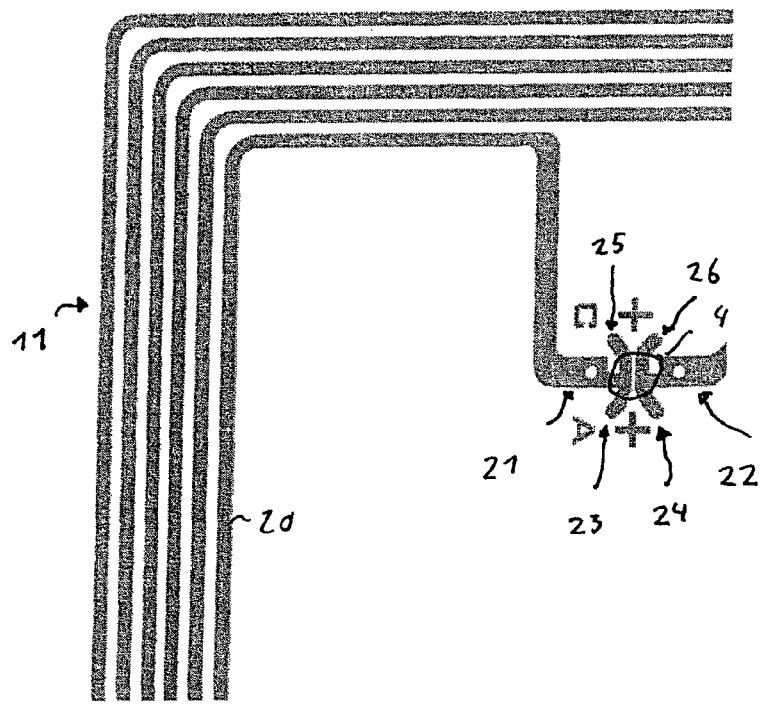
FIG. 2 shows a view illustrating a shape of a conductive layer for the film body of FIG. 1.

FIG. 2 shows a part of a plan view of the conductive layer 11. The conductive layer 11 is provided in the form of a plurality of conductor tracks which are in the shape of the electrically conductive structure to be produced. Thus FIG. 2 shows a conductor track 20 which is shaped in the form of an antenna coil for providing an HF antenna of an RFID transponder. One conductor track end 21 of the conductor track 20 is arranged in a region 4 in spaced relationship with a conductor track end 22 of another conductor track. The two conductor track ends are spaced from each other over a width of between 400 and 5000 μm or greater at only between about 200 and 20 μm. In addition to that shaping, which is functionally necessary from the electronic point of view, of those conductor track portions (the circuit chip 13 is disposed in the region 4 and contacted with the conductor track end 21 and the conductor track end 22 by way of an electrically conductive adhesive), conductor track extensions 23, 24, 25 and 26 are provided, which prevent the closely adjacently arranged conductor track ends 21 and 22 from growing together during the subsequent galvanic coating operation. The conductor track portions 23 and 25 are arranged on both sides of the conductor track end 21, directly adjoining the conductor track end 21. The conductor track extensions 24 and 26 are arranged on both sides of the conductor track end 22, directly adjoining the conductor track end 22. The conductor track extensions 23 and 25 are shaped to be curved convexly away from the oppositely disposed conductor track end 22 and with their front edge in opposite relationship to the conductor track end 22, directly adjoin the front edge of the conductor track end 23 so that the front edge of the conductor track end 21 blends smoothly into the front edge of the conductor track extensions 23 and 25. That transition thus occurs without the formation of acute angles and the common curve function describing the front edge of the conductor track end 21 and of the conductor track extensions 23 and 25 does not have any non-differentiable locations. The same applies to the conductor track end 22 and the conductor track extensions 24 and 26 directly adjoining the conductor track end 22.

The carrier substrate with the electrically conductive layer 11 formed thereon then passes through a galvanizing bath in which the electrically conductive layer 12 is deposited on the conductive layer 11 by the application of a flow of current in an electrolyte which contains a dissolved coating metal. In that respect preferably copper, chromium, gold, silver, nickel or zinc is used as the coating material. For that purpose it is possible for example to use a bath of the following composition:

|  | Proportions by weight |
| --- | --- |
| Distilled $H_2O$ | 1000 |
| $CuSO_4$ | 50 |
| $H_2SO_4$ (98%) | 10 |
| L-ascorbic acid | 5 |

In this case the conductive layer 11 is contacted with a current source by preferably bar-shaped contact electrodes guided in a circular movement so that the conductive layer 11 forms an electrode of the current flow in the galvanizing bath and the coating metal is deposited on the conductive layer 11. In that way a layer thickness in respect of the electrically conductive structures of between 1 and about 50 μm can be achieved by electrolytic reinforcement. If operation is implemented under the conditions set out below, a thickness of about 12 μm is achieved when using copper:

Deposit voltage 10 V
Current density about 12 $A/dm^2$
Deposit duration between about 1.5 and 2 minutes
Bath temperature 50° C.

In this connection it is to be pointed out that the thickness of the metal layer 12 μm becomes correspondingly greater, the greater the current density, the deposit voltage and/or the deposit time.

After leaving the galvanic bath the film body 1 is cleaned, for example by a neutralizing liquid and/or distilled water. Drying is then effected.

Figure 3:
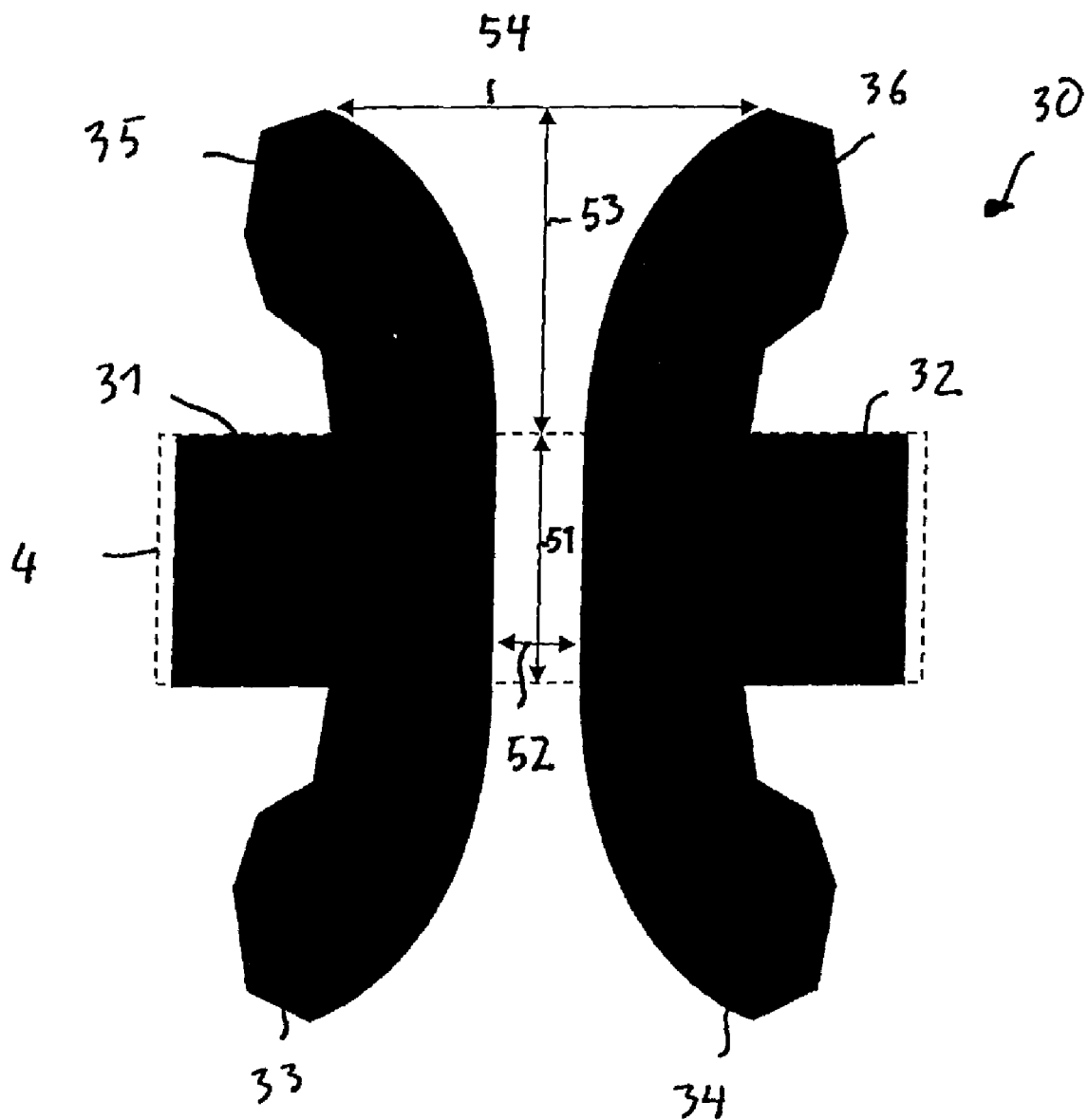
FIG. 3 shows a view illustrating a shape of a conductive layer which can be used in the process according to the invention.

Reference is now made to FIG. 3 to describe a further embodiment for shaping the conductive layer 11 in the region of two closely adjacent conductor track portions.

FIG. 3 shows a region 4 with two conductor track portions 31 and 32. The conductor track portions 31 and 32 form for example conductor track ends of two conductor tracks (not shown here). The mutually facing end faces of the conductor track portions 31 and 32 are oriented substantially parallel to a common straight line in the region 4 defined by the width of the conductor track portions 31 and 32. In this arrangement the width 51 of the region 4 is preferably selected to be in a range of between 400 and 800 μm but it can also be greater. In this case the conductor track portions 31 and 32 are spaced from each other at a spacing 52, wherein the spacing 52 is between 500 μm and 1 μm, preferably less than 200 μm. With such a small spacing between the mutually facing flanks of the conductor track portions 31 and 32, in the subsequent galvanic deposit of the coating material, the two conductor track portions 31 and 32 would grow together in the region of the limit lines of the region 4, indicated by the broken lines, and the conductive structure would thus become inoperable. To avoid that phenomenon, there are conductor track extensions 33, 34, 35 and 36 which directly connect to the conductor track portions 31 and 32. In this respect the shaping of the conductor track extensions 33, 34, 35 and 36 is so selected that the front edge which faces towards the oppositely disposed conductor track portion is curved convexly away from the oppositely disposed conductor track portion. The conductor track extensions 33 through 36 are thus curved away from the configuration defined by the front edges of the conductor track portions 31 and 32 and thus involve a curvature in relation to the common straight line defined by the oppositely disposed flanks of the conductor track portions 31 and 32. The radius of curvature describing the mutually opposite front edges of the conductor track extensions 33, 34, 35 and 36 can change along the front edges, the radius of curvature preferably being selected to be greater than the width 51.

The rear edge of the conductor track extensions 33 through 36 can be of any desired shape. There is thus no need for the rear edge to be convexly curved. It may have no curvature or it may also be concavely curved.

The conductor track extensions 35 and 36 are of an extent 53 in the direction of the straight line defined by the front edge, that faces towards the respective other conductor track portion, of the associated conductor track portion, which corresponds at least to half the width 51, preferably at least three times the width 51. The spacing 54 of the ends of the oppositely disposed conductor track extensions 35 and 36 which are convexly curved away are preferably spaced from each other at more than 500 μm. In that respect the reference to the ends of the conductor track extensions means the point defined by the end point of the front edge of the conductor track extensions, as is shown in FIG. 3.

What is claimed is:

1. A process for the production of an electrically conductive structure on a carrier substrate (10) including at least two conductor track portions (21, 22; 31, 32) spaced in a region (4) of a width b over the entire width b at between 500 μm and 1 μm, the process comprising the steps of:
producing a conductive layer (11) in the form of the conductor track portions (21, 22; 31, 32) on the surface of the carrier substrate (10); and
depositing a metallic coating (12) forming the electrically conductive structure on the conductive layer by application of a flow of current in an electrolyte which contains a dissolved coating metal, wherein the conductive layer (11, 30) is produced in the form of conductor track extensions (23, 24, 25, 26) which are arranged on both sides of the conductor track portions (21, 22; 31, 32) and which are convexly curved away from the oppositely disposed conductor track portion (22, 21; 32, 31).

2. A process as set forth in claim 1, wherein the oppositely disposed flanks of the two conductor track portions (21, 22; 31, 32) are oriented substantially parallel to a common straight line in the region (4) over the entire width b.

3. A process as set forth in claim 1, wherein the width b is greater than 400 μm, in particular greater than 700 μm.

4. A process as set forth in claim 1, wherein the conductor track portions (21, 22; 31, 32) are spaced from each other in the region (4) over the entire width b at less than 300 μm, in particular are spaced from each other at between 200 μm and 20 μm.

5. A process as set forth in claim 1, wherein the curved conductor track extensions (23, 24, 25, 26; 33, 34, 35 and 36) are provided on both sides of each of the two conductor track portions directly adjoining the respective conductor track portion.

6. A process as set forth in claim 1, wherein the front edge of the conductor track extensions, that faces towards the respective other conductor track portion, is convexly curved, but not the rear edge of the conductor track extensions, that faces away from the respective other conductor track portion.

7. A process as set forth in claim 1, wherein the ends of the oppositely disposed conductor track extensions (33, 34; 35, 36) which are curved convexly away from each other are more than 500 μm away from each other.

8. A process as set forth in claim 1, wherein the radius of curvature defining the curvature of the conductor track extensions is greater than the width b.

9. A process as set forth in claim 1, wherein the extent of the conductor track extensions in the direction of the straight line defined by the front edge of the associated conductor track portion, that faces towards the respective other conductor track portion, corresponds at least to half the width b.

10. A process as set forth in claim 1, wherein the conductive layer (11, 30) is produced by printing a conductive printing material onto the surface of the carrier substrate (10).

11. A multi-layer film body (1) comprising:
a carrier substrate (10);
a conductive layer (11) formed in a pattern on the surface of the carrier substrate; and
a metallic coating (12) which forms an electrically conductive structure and which is deposited on the conductive layer (11), the electrically conductive layer (11) being disposed in a region of a width b in the form of two conductor track portions (21, 22) which are spaced over the entire width b at between 500 μm and 1 μm, the conductive layer (11) including conductor track extensions which are arranged on both sides of the conductor track portions (21, 22) and which are convexly curved away from the oppositely disposed conductor track portion.

12. A multi-layer film body (1) as set forth in claim 11, wherein the carrier substrate comprises a plastic material film of a thickness of between 12 and 150 μm.

13. A multi-layer film body (1) as set forth in claim 11, wherein the conductive layer (11) comprises a conductive printing material.

14. A multi-layer film body (1) as set forth in claim 11, wherein the metallic coating (12) is of a thickness of between 1 and 50 μm.

15. A multi-layer film body (1) as set forth in claim 11, wherein the two conductor track portions (21, 22) are formed by mutually oppositely disposed conductor track ends.

16. A multi-layer film body (1) as set forth in claim 11, wherein the conductive structure is in the form of an antenna.

17. A multi-layer film body (1) as set forth in claim 11, wherein the film body (1) has a circuit chip (13) and the circuit chip is arranged in the region (4) and is electrically contacted with the two conductor track portions (21, 22).

18. A multi-layer film body (1) as set forth in claim 17, wherein the width b is greater than the edge length of the circuit chip (13).

19. A multi-layer film body (1) as set forth in claim 18, wherein the width b is 80 μm greater than the edge length of the circuit chip (13).

20. A process for the production of an electrically conductive structure on a carrier substrate, the process comprising the steps of:
producing a conductive layer in the form of at least two conductor track portions disposed in a region on the surface of the carrier substrate, the at least two conductor track portions spaced between 500 μm and 1 μm apart from one another within the region; and
depositing a metallic coating forming the electrically conductive structure on the conductive layer by application of a flow of current in an electrolyte which contains a dissolved coating metal, wherein the conductive layer is produced to include conductor track extensions which extend beyond the region, at least a portion of the conductor track extensions convexly curving away from an oppositely disposed conductor track portion.

* * * * *